United States Patent
Ogihara et al.

(10) Patent No.: US 8,343,711 B2
(45) Date of Patent: Jan. 1, 2013

(54) PATTERNING PROCESS

(75) Inventors: Tsutomu Ogihara, Jyoetsu (JP);
Takafumi Ueda, Jyoetsu (JP);
Toshiharu Yano, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 316 days.

(21) Appl. No.: 12/662,078

(22) Filed: Mar. 30, 2010

(65) Prior Publication Data
US 2010/0273110 A1    Oct. 28, 2010

(30) Foreign Application Priority Data
Apr. 24, 2009   (JP) ................................ 2009-106660

(51) Int. Cl.
*G03F 7/26* (2006.01)
(52) U.S. Cl. ........................ 430/315; 430/329
(58) Field of Classification Search ............... 430/314, 430/315
See application file for complete search history.

(56) References Cited

U.S. PATENT DOCUMENTS

| | | | |
|---|---|---|---|
| 5,294,680 A | 3/1994 | Knors et al. | |
| 5,908,738 A | 6/1999 | Sato et al. | |
| 8,105,764 B2 * | 1/2012 | Hatakeyama et al. | 430/323 |
| 2006/0019195 A1 | 1/2006 | Hatakeyama et al. | |
| 2007/0122740 A1 | 5/2007 | Hatakeyama et al. | |
| 2008/0038662 A1 | 2/2008 | Hatakeyama et al. | |
| 2008/0090172 A1 | 4/2008 | Hatakeyama et al. | |
| 2008/0118860 A1 | 5/2008 | Harada et al. | |
| 2008/0248426 A1 | 10/2008 | Thackeray et al. | |
| 2010/0040838 A1 * | 2/2010 | Abdallah et al. | 428/195.1 |
| 2010/0120255 A1 * | 5/2010 | Matsunaga et al. | 438/704 |

FOREIGN PATENT DOCUMENTS

| | | |
|---|---|---|
| JP | A-06-118631 | 4/1994 |
| JP | A-06-118656 | 4/1994 |
| JP | B2-07-069611 | 7/1995 |
| JP | A-08-087115 | 4/1996 |
| JP | A-08-179509 | 7/1996 |
| JP | A-2004-153125 | 5/2004 |
| JP | A-2004-205685 | 7/2004 |
| JP | A-2004-264710 | 9/2004 |
| JP | A-2005-043471 | 2/2005 |
| JP | A-2005-128509 | 5/2005 |
| JP | A-2005-250434 | 9/2005 |

(Continued)

OTHER PUBLICATIONS

Fedynshyn, "Advances in Resist Technology and Processing XIX," Proceedings of SPIE, 2002, vol. 4690, xxix.

(Continued)

*Primary Examiner* — Kathleen Duda
(74) *Attorney, Agent, or Firm* — Oliff & Berridge, PLC

(57) ABSTRACT

There is disclosed a patterning process comprises at least (1) a step of forming an organic underlayer film on a substrate and then forming a photoresist pattern on the organic underlayer film, (2) a step of attaching an alkaline solution containing an alkaline substance onto the photoresist pattern and then removing the excess alkaline solution, (3) a step of applying a solution of a siloxane polymer crosslinkable by action of the alkaline substance onto the photoresist pattern to form a crosslinked part by crosslinking the siloxane polymer near the photoresist patterns, and (4) a step of removing the uncrosslinked siloxane polymer and the photoresist pattern. There can be provided a patterning process capable of forming a further finer pattern simply and efficiently and with a high practicability applicable to semiconductor manufacturing.

17 Claims, 2 Drawing Sheets

FOREIGN PATENT DOCUMENTS

| | | |
|---|---|---|
| JP | A-2007-171895 | 7/2007 |
| JP | A-2007-199653 | 8/2007 |
| JP | A-2007-293294 | 11/2007 |
| JP | A-2008-065303 | 3/2008 |
| JP | A-2008-111103 | 5/2008 |
| JP | A-2008-122932 | 5/2008 |
| JP | A-2008-274250 | 11/2008 |
| JP | A-2009-014816 | 1/2009 |

OTHER PUBLICATIONS

Owa et al., "Immersion lithography; its potential performance and issues," Proceedings of SPIE, 2003, vol. 5040, p. 724.

Shibuya et al., "Performance of Resolution Enhancement Technique Using Both Multiple Exposure and Nonlinear Resist," Jpn. J. Appl. Phys., 1994; vol. 33, p. 6874-6877, Part 1, No. 12B.

Fritze et al., "Nanofabrication with deep-ultraviolet lithography and resolution enhancements," J. Vac. Sci. Technol. B17(6), 1999, pp. 3310-3313.

Kono et al., "Implementation of immersion lithography to NAND/CMOS device manufacturing," 4th International Symposium on Liquid Immersion, 2007, Presentation No. PR-01 (24 slides).

* cited by examiner

PATTERNING PROCESS

BACKGROUND OF THE INVENTION

1. Field of the Invention

The present invention relates to a patterning process using a sidewall spacer method.

2. Description of the Related Art

In recent years, as LSI progresses toward higher integration and further acceleration in speed, miniaturization of a pattern rule is required. In the light-exposure used as a general technology nowadays, resolution inherent in wavelength of a light source is approaching to its limit. In 1980s, a g-line (436 nm) or an i-line (365 nm) of a mercury lamp was used as an exposure light. As a mean for further miniaturization, shifting to a shorter wavelength of an exposing light was assumed to be effective. As a result, in a mass production process after DRAM (Dynamic Random Access Memory) with 64-megabits (0.25 μm or less of a processing dimension) in 1990s, a KrF excimer laser (248 nm), a shorter wavelength than an i-line (365 nm), was used in place of an i-line as an exposure light source.

However, in production of DRAM with an integration of 256 M, 1 G and higher which require further miniaturized process technologies (process dimension of 0.2 μm or less), a light source with a further short wavelength is required, and thus a photo lithography using an ArF excimer laser (193 nm) has been investigated seriously since about a decade ago. At first, an ArF lithography was planned to be applied to a device starting from a 180-nm node device, but a KrF excimer laser lithography lived long to a mass production of a 130-nm node device, and thus a full-fledged application of an ArF lithography will start from a 90-nm node. Further, a study of a 65-nm node device by combining with a lens having an increased NA till 0.9 is now underway. Further shortening of wavelength of an exposure light is progressing towards the next 45-nm node device, and for that an $F_2$ lithography with a 157-nm wavelength became a candidate. However, there are many problems in an $F_2$ lithography; an increase in cost of a scanner due to the use of a large quantity of expensive $CaF_2$ single crystals for a projector lens, extremely poor sustainability of a soft pellicle, which leads to a change of an optical system due to introduction of a hard pellicle, a decrease in an etching resistance of a resist film, and the like. Because of these problems, it was proposed to postpone an $F_2$ lithography and to introduce an ArF immersion lithography earlier (Proc. SPIE Vol. 4690, xxix).

In an ArF immersion lithography, a proposal is made to impregnate water between a projector lens and a wafer. A refractive index of water at 193 nm is 1.44, and therefore a pattern formation is possible even if a lens with a numerical aperture (NA) of 1.0 or more is used, and moreover, theoretically NA may be increased to near 1.44. In the beginning, deterioration of a resolution and a shift of a focus due to a change of refractive index associated with a change of water temperature were pointed out. However, the problems associated with the change in the refractive index have been solved by controlling the water temperature within 1/100° C. In addition, it was also confirmed that the effect of heat generation from a resist film by light exposure was almost insignificant. As to the concern of a pattern transcription of microbubbles in water, it was also confirmed that formation of bubbles from a resist film by exposure was insignificant if water is fully degassed.

In the early period of an immersion lithography in 1980s, a proposal was made to immerse an entire stage into water. However, a partial fill method having a nozzle of water supply and of drainage in which water is introduced only between a projector lens and a wafer in order to meet the movement of a high-speed scanner was adopted. By an immersion using water, designing of a lens with NA of 1 or higher became theoretically possible. However, there appeared a problem in it that a lens dimension in an optical system based on a conventional refractive index system becomes extraordinary large thereby leading to distortion of a lens due to its own weight. A proposal was made to design a catadioptric optical system for a more compact lens, which accelerated a speed in designing a lens having NA of 1.0 or more. Now a possibility of a 45-nm node is shown by combining a lens having NA of 1.2 or more with a super resolution technology (Proc. SPIE Vol. 5040, p. 724), and in addition, a development of a lens with NA 1.35 is underway.

As a 32-nm node lithography technique, a lithography of a vacuum ultraviolet beam (EUV) with a wavelength of 13.5 nm is known. Problems of an EUV lithography are requirements for a higher laser output power, a higher sensitivity of a resist film, a higher resolution, a lower line edge roughness (LWR), a non-defective MoSi laminate mask, a lower aberration of a reflective mirror, and the like, and thus there are mounting problems to be solved.

A maximum resolution in a water immersion lithography using a lens with NA of 1.35 is 40 to 38 nm, and there is no possibility to reach 32 nm. Accordingly, development of a material having a higher refractive index is underway to increase NA further. A limiting factor of NA in a lens is determined by a minimum refractive index among a projector lens, a liquid, and a resist film. In the case of a water immersion, a refractive index of water is the lowest as compared with a projector lens (refractive index of a synthetic quartz is 1.5) and a resist film (refractive index of a conventional methacrylate type is 1.7), and thus NA of the projector lens has been determined by a refractive index of water. Recently, a highly transparent liquid having a refractive index of 1.65 is under development. In this case, a refractive index of a projector lens made of a synthetic quartz is the lowest, and thus a material for a projector lens with a high refractive index needs to be developed. A refractive index of LUAG ($Lu_3Al_5O_{12}$) is 2 or more, and thus it is expected as the most promising material, but has problems of a large double refraction and absorption. In addition, even though a projector lens material with a refractive index of 1.8 or more is developed, the highest NA reachable is 1.55 for a liquid with a refractive index of 1.65, and thus 32 nm may not be resolved.

To resolve 32 nm, a liquid with a refractive index of 1.8 or more is necessary. However, a material for it has not been found yet, because an absorption and a refractive index are in a trade-off relationship at the moment. In case of an alkane compound, a bridged cyclic compound is more preferable than a linear compound in order to increase a refractive index, but a cyclic compound has a problem that it cannot follow a high-speed scanning of a stage of an exposure instrument because of its high viscosity. In addition, if a liquid having a refractive index of 1.8 is developed, a minimum refractive index lies in a resist film, and therefore, a resist film with a refractive index of 1.8 or more is also needed.

Recently, a double patterning process, in which a pattern is formed by a first exposure and development, and a pattern is formed by a second exposure exactly in a space of the first pattern, is drawing an attention (Jpn. J. Appl. Phys., Vol. 33 (1994), p. 6874-6877, Part 1, No. 12B, December 1994). Many processes are proposed as the double patterning method. For example, there is a method in which a photoresist pattern with a line and space interval of 1:3 is formed by a first exposure and development, an underlying hard mask is processed by dry etching, an another hard mask is formed on it, then, by exposure and development of a photoresist film to form a line pattern in a space formed by the first exposure, and then the hard mask is dry etched to form a line-and-space pattern with a half width of the first pattern pitch. There is also another method in which a photoresist pattern with a space and line interval of 1:3 is formed by a first exposure and development, an underlying hard mask is processed by dry etching, a photoresist film is applied on it, the second space-pattern is exposed on a remaining part of the hard mask, and then the hard mask is dry etched. In both methods, hard masks are processed by two dry etching steps.

In the former methods as mentioned above, a hard mask needs to be made twice. In the latter method, only one layer of a hard mask is needed, but a trench pattern, in which a resolution is more difficult as compared with a line pattern, needs to be formed. In the latter method, a negative resist composition may be used for formation of a trench pattern. With this method, a high contrast light similar to that used to form a line by a positive pattern may be used. However, a negative resist composition has a lower dissolution contrast as compared with a positive resist composition, and thus, a negative resist composition gives a lower resolution power as compared with the case in which lines are formed by a positive resist composition when a negative resist composition is used to form the same dimension of a trench pattern. In the latter method, it may be possible to apply a thermal flow method, in which a wide trench pattern is formed by using a positive resist composition and then the trench pattern is shrunk by heating a substrate, and a RELACS method in which a water-soluble layer is coated on a trench pattern after development and then the trench is shrunk by a thermal crosslink of a resist film surface. In these methods, however, there are problems of deterioration of a proximity bias and a low throughput due to further complicated processes.

In the both former and the latter methods, two etchings are necessary in substrate processing, thereby causing problems of a lower throughput as well as a deformation and a misalignment of the pattern due to these two etchings.

To perform the etching only once, there is a method in which a negative resist composition is used in the first exposure and a positive resist composition is used in the second exposure. There is another method in which a positive resist composition is used in the first exposure and a negative resist composition dissolved in a higher alcohol having 4 or more carbon atoms and not dissolving the positive resist composition is used in the second exposure. In these methods, a resolution is deteriorated due to the use of a negative resist composition having a low resolution.

The most critical problem in the double patterning is an overlay accuracy of the first and the second patterns. A magnitude of the position displacement corresponds to variation of the line dimension. Thus, for example, to form a 32-nm line with 10% accuracy, an overlay accuracy within 3.2 nanometers is necessary. Because an overlay accuracy of a currently used scanner is about 8 nm, a substantial improvement in the accuracy is necessary.

Because of problem of the overlay accuracy of a scanner and the difficulty to divide one pattern into two, a method in which a pitch is divided into halves in a single exposure is investigated.

A method in which a pitch is divided into halves by forming films on both sides of a line pattern sidewall is proposed (J. Vac. Sci. Technol. B17(6), November/December 1999). For this sidewall spacer method, a spacer space method, in which a hard mask under the resist film and a film embedded into a space between films attached on its sidewall are used as an etching pattern, and a spacer line method, in which a film attached on a hard mask sidewall under the resist film is used as an etching pattern, are proposed (4th International Symposium on Liquid Immersion (2007), Presentation No.: PR-01, Title: Implementation of immersion lithography to NAND/CMOS device manufacturing).

These processes are proposed, but no more practicable method or art has been proposed yet under present circumstances.

As discussed above, with the progress of miniaturization of the pattern rule in recent years, a patterning process to form a further finer pattern simply and efficiency is desired.

SUMMARY OF THE INVENTION

The present invention was made in view of the circumstances as mentioned above and has an object to provide a highly practicable patterning process capable of forming a further finer pattern simply and efficiently and applicable to semiconductor manufacturing.

To solve the problems as mentioned above, the present invention provides a patterning process to form a pattern on a substrate by a lithography, wherein the patterning process comprises at least:
(1) a step of forming a photoresist pattern, involving forming an organic underlayer film on a substrate, forming a resist film on the organic underlayer film by using a chemically amplified positive photoresist composition, exposing the resist film to a high energy beam, and then developing the resist film by a developer,
(2) a step of attaching an alkaline solution containing an alkaline substance onto the photoresist pattern, and then removing the excess alkaline solution,
(3) a step of applying a solution of a siloxane polymer crosslinkable by action of the alkaline substance onto the photoresist pattern attached with the alkaline solution to fill a space between the neighboring photoresist patterns with the siloxane polymer thereby forming a crosslinked part by crosslinking the siloxane polymer near the photoresist patterns to form a repeating structure arranged sequentially in the order of the photoresist pattern, the crosslinked part, the uncrosslinked siloxane polymer, and the crosslinked part, and
(4) a step of removing the uncrosslinked siloxane polymer and the photoresist pattern.

According to the patterning process as mentioned above, a fine pattern can be formed simply and efficiently. In addition, the organic underlayer film can be dry etched by using a mask of the siloxane pattern (crosslinked part) formed in the step (4), and then the substrate can be dry etched by using a mask of the organic underlayer film thus processed. Accordingly, a conventional process technology can be applied.

Meanwhile, in the past, as the substance to accelerate the curing rate of a polysiloxane compound, an acid generator contained in a resist pattern has been used. However, there has been a drawback of a poor efficiency in such a process that only the polysiloxane compound of a resist pattern sidewall is cured. That is, because this acid generator is distributed uniformly in the resist pattern, a relatively high temperature is necessary to migrate the acid catalyst from inside the resist pattern to its surface. In addition, because of this high curing temperature, the diffusion rate of the acid catalyst is increased also inside the polysiloxane, thereby leading to a problem of difficulty in dimensional control of the sidewall.

On the other hand, in the present invention, a carboxylic acid residue after an acid-labile group is eliminated is distributed on surface of a photoresist pattern, and thus, when an alkaline solution containing an alkaline substance is contacted with this, a neutralization reaction between this carboxylic acid residue on the photoresist pattern surface and the alkaline substance contained in the alkaline solution takes place. As a result, the alkaline solution containing the alkaline substance can be attached onto the photoresist pattern surface. Because this alkaline substance serves as a curing catalyst of a polysiloxane compound (siloxane polymer), it can act more efficiently on the photoresist pattern surface as compared with the conventional procedure that cures the photoresist pattern sidewall by action of an acid catalyst. Accordingly, the curing temperature can be lowered, and thus dimension of the siloxane pattern can be controlled more precisely.

Further, it is preferable to form an anti-reflection film between the organic underlayer film and the resist film in the step (1).

By forming the anti-reflection film between the organic underlayer film and the resist film as mentioned above, deterioration of the pattern profile at the time of forming the resist pattern can be avoided.

In addition, an organic anti-reflection film not containing a silicon atom can be formed as the foregoing anti-reflection film.

The alkaline solution to be attached onto the photoresist pattern is preferably an organic solvent solution or an aqueous solution containing an organic amine or an organic ammonium hydroxide.

As mentioned above, the alkaline solution containing an alkaline substance may be exemplified by, for example, an organic solvent solution or an aqueous solution containing an organic amine or an organic ammonium hydroxide.

In addition, it is preferable that the alkaline solution to be attached onto the photoresist pattern be the one not dissolving the photoresist pattern.

In the step (2), in order to attach the alkaline solution containing an alkaline substance onto the photoresist pattern, it is preferable that the alkaline solution be the one not dissolving the photoresist pattern.

It is preferable that, in the step (3), the crosslinked part be formed by a heat-treatment at the temperature of 30 to 200° C. and the time of 1 to 500 seconds after filling the space between the neighboring photoresist patterns with the siloxane polymer.

It is preferable that the heat-treatment be done under such conditions because the siloxane polymer near the photoresist patterns can be crosslinked.

In the step (4), the uncrosslinked siloxane polymer may be removed, and thereafter the photoresist pattern may be removed.

For example, when the siloxane polymer solution is applied rather thick in the step (3), the uncrosslinked siloxane polymer may be removed firstly, and then the photoresist pattern may be removed.

Further, in the step (4), the uncrosslinked siloxane polymer and the photoresist pattern may be removed simultaneously.

For example, when the siloxane polymer solution is applied in such a way as to expose the upper part of the photoresist pattern in the step (3), the uncrosslinked siloxane polymer and the photoresist pattern may be removed simultaneously.

A product obtained from the hydrolysis-condensation of a monomer represented by the following general formula (1) can be used as the siloxane polymer crosslinkable by action of the alkaline substance.

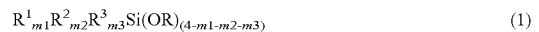  (1)

(R represents an alkyl group having 1 to 3 carbon atoms; each $R^1$, $R^2$, and $R^3$ independently represents a hydrogen atom or a monovalent organic group having 1 to 30 carbon atoms; and m1, m2, and m3 independently represents 0 or 1.)

As discussed above, by using the patterning process of the present invention, a fine pattern can also be formed conveniently by a usual exposure method using an ArF excimer laser. In addition, the curing temperature can be made lower as compared with a conventional method for curing a resist pattern sidewall, and thus dimension of a siloxane pattern can be controlled more precisely. Accordingly, the patterning process of the present invention can be suitably applied to the semiconductor manufacturing process, and thus an extremely practical patterning process can be provided.

DETAILED DESCRIPTION OF THE PREFERRED EMBODIMENTS

Hereinbelow, the present invention will be explained more specifically.

As mentioned above, with the progress of miniaturization of the pattern rule in recent years, a highly practicable patterning process capable of forming a further finer pattern simply and efficiently and applicable to a semiconductor manufacturing process has been regarded as a necessary requirement.

Inventors of the present invention carried out extensive investigation to achieve the object as mentioned above, and as a result, found that a pattern could be formed simply and efficiently on a substrate by a patterning process comprising at least:

(1) a step of forming a photoresist pattern, involving forming an organic underlayer film on a substrate, forming a resist film on the organic underlayer film by using a chemically amplified positive photoresist composition, exposing the resist film to a high energy beam, and then developing the resist film by a developer, (2) a step of attaching an alkaline solution containing an alkaline substance onto the photoresist pattern, and then removing the excess alkaline solution, (3) a step of applying a solution of a siloxane polymer crosslinkable by action of the alkaline substance onto the photoresist pattern attached with the alkaline solution to fill a space between the neighboring photoresist patterns with the siloxane polymer thereby forming a crosslinked part by crosslinking the siloxane polymer near the photoresist patterns to form a repeating structure arranged sequentially in the order of the photoresist pattern, the crosslinked part, the uncrosslinked siloxane polymer, and the crosslinked part, and (4) a step of removing the uncrosslinked siloxane polymer and the photoresist pattern.

Figure 1:
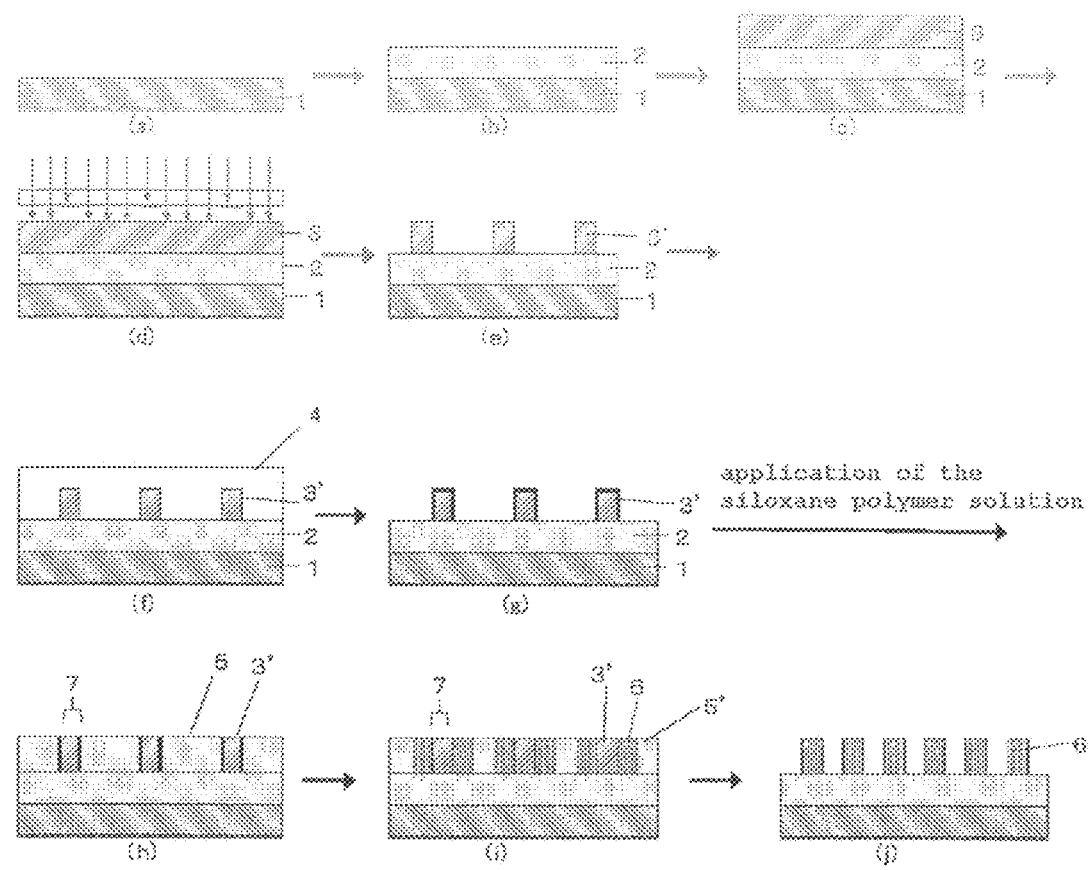
FIG. 1 is an explanatory drawing of one embodiment of the patterning process of the present invention.

An embodiment of the present invention as mentioned above will be described by using the Figures. FIG. 1 is an explanatory drawing of one embodiment of the patterning process of the present invention.

Firstly, in the step (1), an organic underlayer film 2 is formed on a substrate 1 (FIGS. 1(*a*) and 1(*b*)), and then a resist film 3 is formed on the organic underlayer film 2 by using a chemically amplified positive photoresist composition (FIG. 1(*c*)). Thereafter, the resist film 3 is exposed to a high energy beam (FIG. 1(*d*)) and then developed by a developer to form a photoresist pattern 3' (FIG. 1(*e*)).

Then, in the step (2), an alkaline solution 4 containing an alkaline substance is attached onto the photoresist pattern 3' (FIG. 1(*f*)). Thereafter, the excess alkaline solution 4 is removed (FIG. 1(*g*)).

Subsequently, in the step (3), a solution of a siloxane polymer crosslinkable by action of the alkaline substance is applied onto the photoresist pattern 3' attached with the alkaline solution to fill a space between the neighboring photoresist patterns 3' with a siloxane polymer 5 (FIG. 1(*h*)), thereby forming a crosslinked part 6 by crosslinking the siloxane polymer 5 near the photoresist patterns 3' (FIG. 1(*i*)). With this, a repeating structure sequentially arranged in the order of the photoresist pattern 3', the crosslinked part 6, the uncrosslinked siloxane polymer 5', and the crosslinked part 6 is formed.

Then, in the step (4), the uncrosslinked siloxane polymer 5' and the photoresist pattern 3' are removed to form the pattern of the crosslinked part 6 (siloxane pattern) (FIG. 1(*j*)).

Further, in the patterning process of the present invention, the organic underlayer film is etched after the step (4) by using a mask of the siloxane pattern (crosslinked part 6) in a similar manner to that of a conventional method, and then a pattern can be formed on the substrate by using a mask of the obtained organic underlayer film pattern.

Hereinbelow, each step will be elaborated in turn.

In the step (1), the organic underlayer film 2 can be formed on the substrate 1 by such a method as a spin coat method (FIGS. 1(*a*) and 1(*b*)).

The substrate 1 may be the one having a layer to be processed on a base substrate. The base substrate is not particularly restricted, and a material, such as Si, an amorphous silicon (α-Si), p-Si, $SiO_2$, SiN, SiON, W, TiN, and Al, which are different from those used in the layer to be processed, may be used. The layer to be processed may be Si, $SiO_2$, SiN, SiON, p-Si, α-Si, W, W—Si, Al, Cu, Al—Si etc., and various kinds of a film having a low dielectric constant and its etching-stopper film. The formed thickness is usually 50 to 10,000 nm, and in particular 100 to 5,000 nm.

Figure 2:
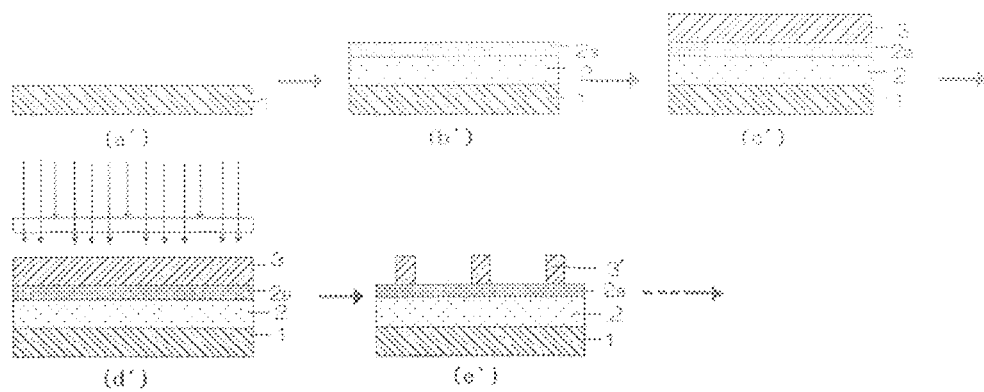
FIG. 2 is an explanatory drawing of another embodiment of the patterning process of the present invention.

The organic underlayer film 2 is not particularly restricted, but the film that can express a function as the anti-reflection film fully at the time of patterning of the resist film is preferable. Further, the anti-reflection film 2*a* may be formed between the organic underlayer film 2 and the resist film 3 (FIGS. 2(*a'*) to 2(*c'*)). Even in the case in which the anti-reflection film 2*a* is formed as mentioned above, the patterning process of the present invention can be applied suitably (FIGS. 2(*d'*) and 2(*e'*)).

As the anti-reflection film 2*a*, an organic anti-reflection film not containing a silicon atom may be formed. In this case, it is further preferable that the anti-reflection function be expressed by combining the anti-reflection function of the organic underlayer film 2 with the organic anti-reflection film not containing a silicon atom, because it can also be used in a lithography process using a high NA exposure instrument.

The organic underlayer film 2 must function as the etching mask at the time of the substrate etching, and thus a material having a high etching selectivity with the substrate, specifically a material having an aromatic skeleton is preferable.

Many organic films as the underlayer film like this are known as the underlayer film for a three-layer resist method, or a two-layer resist method using a silicon-containing resist composition. Many resins including a novolak resin, in addition to 4,4'-(9H-fluorene-9-ylidene)bisphenol novolak resin (molecular weight of 11,000) disclosed in Japanese Patent Laid-Open (Kokai) No. 2005-128509, are known as the resist underlayer film composition for the two-layer method and the three-layer method, and any of them can be used.

Further, when a higher heat-resistance than a usual novolak resin is needed, a resin having a skeleton of a naphthalene compound, an acenaphthylene compound, a naphthol compound, or a bisnaphthol compound may be exemplified. Examples of such resins include those disclosed in Japanese Patent Laid-Open (Kokai) No. 2007-199653, Japanese Patent Laid-Open (Kokai) No. 2008-274250, Japanese Patent Laid-Open (Kokai) No. 2004-264710, Japanese Patent Laid-Open (Kokai) No. 2005-043471, Japanese Patent Laid-Open (Kokai) No. 2005-250434, Japanese Patent Laid-Open (Kokai) No. 2007-293294, Japanese Patent Laid-Open (Kokai) No. 2008-65303, Japanese Patent Laid-Open (Kokai) No. 2004-205685, Japanese Patent Laid-Open (Kokai) No. 2007-171895, and Japanese Patent Laid-Open (Kokai) No. 2009-14816. In addition, a polyimide resin (for example, Japanese Patent Laid-Open (Kokai) No. 2004-153125) can also be chosen. In the case in which the organic film is formed at low temperature, a resin of a hydroxy styrene series may also be chosen, wherein introduction of a polycyclic skeleton is effective to increase the etching resistance as well, and thus, for example, indene, fluorene, and the like may be copolymerized.

Examples of the material for the organic anti-reflection film include; a material formed of a condensation product between a diphenylamine derivative and a formaldehyde-modified melamine resin, an alkaline-soluble resin and a light-absorbing agent, as disclosed in Japanese Patent Publication (Kokoku) No. H07-69611; a reaction product between a maleic anhydride copolymer and a diamine type light absorbing agent as disclosed in U.S. Pat. No. 5,294,680; a material containing a resin binder and a thermal crosslinking agent of a methylol melamine series as disclosed in Japanese Patent Laid-Open (Kokai) No. H06-118631; a type based on an acrylic resin containing a carboxylic acid group, an epoxy group, and a light-absorbing group in the same molecule as disclosed in Japanese Patent Laid-Open (Kokai) No. H06-118656; a material formed of a methylol melamine and a benzophenone series light-absorbing agent as disclosed in Japanese Patent Laid-Open (Kokai) No. H08-87115; and a polyvinyl alcohol resin added with a low-molecular weight light-absorbing agent as disclosed in Japanese Patent Laid-Open (Kokai) No. H08-179509.

After the organic underlayer film 2 is formed on the substrate 1, the resist film 3 is formed on the organic underlayer film 2 by using a chemically amplified positive photoresist composition (FIG. 1(*c*)), which is followed by exposure and development to form the photoresist pattern 3' (FIGS. 1(*d*) and 1(*e*)).

A chemically amplified positive photoresist composition is not particularly restricted, but it is preferable to contain a resin having a repeating unit represented by the following general formula (a1).

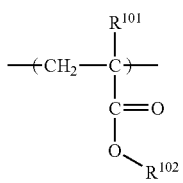

(a1)

(In the formula, $R^{101}$ represents a hydrogen atom or a methyl group. $R^{102}$ represents an acid-labile group.)

A monomer for obtaining a repeating unit having an acid-labile group represented by the general formula (a1) is represented by the following general formula (Ma1). In the formula, $R^{101}$ and $R^{102}$ represent the same as before.

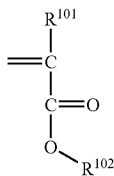

(Ma1)

Specific examples of the repeating unit having an acid-labile group are disclosed in the paragraphs 0083 to 0104, specifically 0114 to 0117, of Japanese Patent Laid-Open (Kokai) No. 2008-111103.

The chemically amplified positive photoresist composition used in the patterning process of the present invention may contain an acid generator, for example, a compound generating an acid by responding to an active light beam or a radiation beam (photo acid generator). Any compound may be used as the photo acid generator as far as it generates an acid by exposure to a high energy beam. Examples of the preferable photo acid generators include a sulfonium salt, an iodonium salt, a sulfonyl diazomethane, a N-sulfonyl oxyimide, and an oxime-O-sulfonate type acid generator etc. They may be used singly or in a combination of two or more kinds. Specific examples of the acid generator are disclosed in the paragraphs 0122 to 0142 of Japanese Patent Laid-Open (Kokai) No. 2008-111103.

The chemically amplified positive photoresist composition used for the patterning process of the present invention may further contain any one or more materials selected from an organic solvent, a basic compound, a dissolution controller, a surfactant, and acetylene alcohols.

Specific examples are disclosed in the paragraphs 0144 to 0145 for the organic solvent, paragraphs 0146 to 0164 for the basic compound, and paragraphs 0165 to 0166 for the surfactant in Japanese Patent Laid-Open (Kokai) No. 2008-111103; and paragraphs 0155 to 0178 for the dissolution controller and paragraphs 0179 to 0182 for the acetylene alcohols in Japanese Patent Laid-Open (Kokai) No. 2008-122932.

The thickness of the resist film 3 is, for example, 10 to 1,000 nm, and particularly preferably 20 to 500 nm. The resist film 3 is exposed and developed to form the photoresist pattern 3'.

Exposure is preferably made with a high energy beam having the wavelength of 140 to 250 nm, and especially exposure by an ArF excimer laser at 193 nm is used most preferably. The exposure amount in the exposure is preferably about 1 mJ/cm$^2$ to about 200 mJ/cm$^2$, or more preferably about 10 mJ/cm$^2$ to about 100 mJ/cm$^2$. Thereafter, it is preferable to carry out the post exposure bake (PEB) on a hot plate at 60 to 150° C. for 1 to 5 minutes, or preferably at 80 to 120° C. for 1 to 3 minutes.

Further, development is carried out in a developer solution such as a solution of tetramethyl ammonium hydroxide (TMAH) with the concentration of 0.1 to 5% by mass or preferably 2 to 3% by mass and the time for 0.1 to 3 minutes or preferably for 0.5 to 2 minutes by such a usual method as a dip method, a puddle method, and a spray method to form an intended pattern on the substrate.

Then, the step (2) will be explained.

In the step (2), the alkaline solution 4 containing an alkaline substance is attached onto the photoresist pattern 3' formed in the step (1) (FIG. 1(f)). When the photoresist pattern 3' is formed in the step (1), there exist, on surface of the photoresist pattern 3', many carboxylic acid groups after an acid-eliminating group (acid-labile group) of the resin in the chemically amplified positive photoresist composition is eliminated. Accordingly, when contacted with the alkaline solution containing an alkaline substance, this carboxylic acid group on the surface of the photoresist pattern 3' undergoes a neutralization reaction with the alkaline substance in the alkaline solution 4 used in the step (2), thereby attaching the alkaline solution 4 containing the alkaline substance onto the photoresist pattern surface.

After the alkaline solution 4 containing the alkaline substance is attached onto the photoresist pattern 3', the excess alkaline solution is removed by such a method as a spin drying, a low temperature baking, and a rinsing with an organic solvent not dissolving the photoresist pattern such as those that will be mentioned later (FIG. 1(g)).

The alkaline solution 4 containing an alkaline substance is preferably the one not dissolving the photoresist pattern 3', wherein an organic solvent solution or an aqueous solution containing an organic amine or an organic ammonium hydroxide may be mentioned as the example of it.

Organic amines including trimethyl amine, triphenyl amine, diazabicycloundecane, and diazabicyclononene are used preferably. In addition, organic ammonium hydroxides including tetramethyl ammonium hydroxide, choline, tetraethyl ammonium hydroxide, tetrapropyl ammonium hydroxide, tetrabutyl ammonium hydroxide, and trimethyl butyl ammonium hydroxide are used preferably.

Here, it is preferable that the alkaline solution containing an alkaline substance be other than the solution used as a developer solution. The example of the solution used as the developer solution is an aqueous tetramethyl ammonium solution, and the like.

As the organic solvent, the one not dissolving the photoresist pattern is preferable, wherein, for example, a higher alcohol having 4 or more carbon atoms may be used. Specific examples of the alcohols include 1-butanol, 2-butanol, 2-methyl-1-propanol, 2-methyl-2-propanol, 1-pentanol, 2-pentanol, 3-pentanol, 2-methyl-1-butanol, 3-methyl-1-butanol, 3-methyl-2-butanol, 1,1-dimethyl-1-propanol, 2,2-dimethyl-1-propanol, 1-hexanol, 2-hexanol, 3-hexanol, 2-methyl-1-pentanol, 3-methyl-1-pentanol, 4-methyl-1-pentanol, 2-methyl-2-pentanol, 3-methyl-2-pentanol, 4-methyl-2-pentanol, 2-methyl-3-pentanol, 3-methyl-3-pentanol, 2,2-dimethyl-1-butanol, 2,3-dimethyl-1-butanol, 2,3-dimethyl-2-butanol, 3,3-dimethyl-1-butanol, 3,3-dimethyl-2-butanol, 2-ethyl-1-butanol, 1-heptanol, 2-heptanol, 3-heptanol, 4-heptanol, 2-methyl-1-hexanol, 3-methyl-1-hexanol, 4-methyl-1-hexanol, 5-methyl-1-hexanol, 2-methyl-2-hexanol, 3-methyl-2-hexanol, 4-methyl-2-hexanol, 5-methyl-2-hexanol, 2-methyl-3-hexanol, 3-methyl-3-hexanol, 4-methyl-3-hexanol, 5-methyl-3-hexanol, 2,2-dimethyl-1-pentanol, 2,3-dimethyl- 1-pentanol, 2,4-dimethyl-1-pentanol, 2-ethyl-1-pentanol, 3-ethyl-1-pentanol, 2,3-dimethyl-2-pentanol, 2,4-dimethyl-2-pentanol, 3,3-dimethyl-2-pentanol, 3,4-dimethyl-2-pentanol, 4,4-dimethyl-2-pentanol, 3-ethyl-2-pentanol, 2,2-dimethyl-3-pentanol, 2,3-dimethyl-3-pentanol, 2,4-dimethyl-3-pentanol, 3-ethyl-3-pentanol, 1-octanol, 2-octanol, 3-octanol, 4-octanol, 2-methyl-1-heptanol, 3-methyl-1-heptanol, 4-methyl-1-heptanol, 5-methyl-1-heptanol, 6-methyl-1-heptanol, 2-methyl-2-heptanol, 3-methyl-2-heptanol, 4-methyl-2-heptanol, 5-methyl-2-heptanol, 6-methyl-2-heptanol, 2-methyl-3-heptanol, 3-methyl-3-heptanol, 4-methyl-3-heptanol, 5-methyl-3-heptanol, 6-methyl-3-heptanol, 2,2-dimethyl-1-hexanol, 2,3-dimethyl-1-hexanol, 2,4-dimethyl-1-hexanol, 2,5-dimethyl-1-hexanol, 2-ethyl-1-hexanol, 3-ethyl-1-hexanol, 4-ethyl-1-hexanol, 2,3-dimethyl-2-hexanol, 2,4-dimethyl-2-hexanol, 2,5-dimethyl-2-hexanol, 3,3-dimethyl-2-hexanol, 3,4-dimethyl-2-hexanol, 3,5-dimethyl-2-hexanol, 4,4-dimethyl-2-hexanol, 4,5-dimethyl-2-hexanol, 3-ethyl-2-hexanol, 4-ethyl-2-hexanol, 2,2-dimethyl-3-hexanol, 2,3-dimethyl-3-hexanol, 2,4-dimethyl-3-hexanol, 2,5-dimethyl-3-hexanol, 3-ethyl-3-hexanol, 4-ethyl-3-hexanol, 2,2,3-trimethyl-1-pentanol, 2,2,4-trimethyl-1-pentanol, 2,3,3-trimethyl-1-pentanol, 2,3,4-trimethyl-1-pentanol, 2,4,4-trimethyl-1-pentanol, 3,3,4-trimethyl-1-pentanol, 3,4,4-trimethyl-1-pentanol, 2-ethyl-2-methyl-1-pentanol, 2-ethyl-3-methyl-1-pentanol, 2-ethyl-4-methyl-1-pentanol, 3-ethyl-2-methyl-1-pentanol, 3-ethyl-3-methyl-1-pentanol, 3-ethyl-4-methyl-2-pentanol, 3-ethyl-3-methyl-2-pentanol, 3-ethyl-4-methyl-2-pentanol, 2-propyl-1-pentanol, 1-nonanol, 2-nonanol, 3-nonanol, 3,5,5-trimethyl-1-hexanol, 2,6-dimethyl-4-heptanol, 3-ethyl-2,2-dimethyl-3-pentanol, 1-decanol, 2-decanol, 3-decanol, 4-decanol, 3,7-dimethyl-1-octanol, 3,7-dimethyl-3-octanol, 1-undecanol, 2-undecanol, 1-dodecanol, 2-dodecanol, 1-tridecanol, 1-tetradecanol, and 1-pentadecanol.

Then, the step (3) will be explained.

In the step (3), a solution of a siloxane polymer crosslinkable by action of an alkaline substance is applied onto the surface of the photoresist pattern 3' attached with the alkaline solution 4 in the step (2) to fill a space between the neighboring photoresist patterns 3' with the siloxane polymer 5 (FIG. 1(h)). Then, the alkaline substance in the alkaline solution 4 attached on surface of the photoresist pattern 3' acts as the catalyst to form the crosslinked part 6 by crosslinking the siloxane polymer 5 near the photoresist patterns 3' (FIG. 1(i)).

With this, a repeating structure arranged sequentially in the order of the photoresist pattern 3', the crosslinked part 6, the uncrosslinked siloxane polymer 5', the crosslinked part 6, the photoresist pattern 3', the crosslinked part 6, and so on can be formed.

Meanwhile, after the siloxane polymer 5 is filled between the neighboring photoresist patterns 3', the thickness of the crosslinked part 6 can be controlled by adjusting the temperature and the time of the heat-treatment. Because the crosslinking is done near the photoresist patterns 3', a relatively low temperature is sufficient for the heat-treatment. Thus, the heat-treatment temperature may be 30 to 200° C. or preferably 60 to 180° C., and the heat-treatment time may be 1 to 500 seconds or preferably 1 to 300 seconds.

A siloxane polymer crosslinkable by action of an alkaline substance is not particularly restricted as far as crosslinkable by action of an alkaline substance, but a product obtained from the hydrolysis-condensation of a monomer represented by the following general formula (1) may be used.

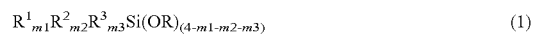

$$R^1{}_{m1}R^2{}_{m2}R^3{}_{m3}Si(OR)_{(4-m1-m2-m3)} \quad (1)$$

(In the formula, R represents an alkyl group having 1 to 3 carbon atoms; each $R^1$, $R^2$, and $R^3$ independently represents a hydrogen atom or a monovalent organic group having 1 to 30 carbon atoms; and m1, m2, and m3 independently represents 0 or 1.)

As the crosslinkable siloxane polymer used in the present invention, the compound obtained by hydrolyzing and condensing one or mixture of two or more selected from monomers which are represented by this general formula (1) may be used.

Here the organic group means the group containing carbon, and may further contain hydrogen, nitrogen, oxygen, sulfur and silicon etc. The organic groups of $R^1$, $R^2$ and $R^3$ can include unsubstituted monovalent hydrocarbon groups such as linear, branched and cyclic alkyl, alkenyl, alkynyl, aryl and aralkyl, and groups obtained by substituting one or more hydrogen atoms of these groups with epoxy, ester, alkoxy and hydroxy, and groups represented by the general formula (2) described later, e.g., the groups mediated by —O—, —CO—, —OCO—, —COO—, and —OCOO—, and organic groups containing a silicon-silicon bond.

Preferable $R^1$, $R^2$ and $R^3$ in the monomer represented by the general formula (1) include a hydrogen atom, alkyl groups such as methyl, ethyl, n-propyl, isopropyl, n-butyl, isobutyl, sec-butyl, t-butyl, n-pentyl, 2-ethylbutyl, 3-ethylbutyl, 2,2-diethylpropyl, cyclopentyl, n-hexyl and cyclohexyl, alkenyl groups such as vinyl and allyl, alkynyl groups such as ethynyl, and further as a light absorbable groups, aryl groups such as phenyl and tolyl, and aralkyl groups such as benzyl and phenythyl are included.

For example, as tetraalkoxysilane where m1=0, m2=0 and m3=0, tetramethoxysilane, tetraethoxysilane, tetra-n-propoxysilane and tetraisopropoxysilane can be exemplified as the monomer. Tetramethoxysilane and tetraethoxysilane are preferable.

For example, as trialkoxysilane where m1=1, m2=0 and m3=0, trimethoxysilane, triethoxysilane, tri-n-propoxysilane, triisopropoxysilane, methyltrimethoxysilane, methyltriethoxysilane, methyltri-n-propoxysilane, methyltriisopropoxysilane, ethyltrimethoxysilane, ethyltriethoxysilane, ethyltri-n-propoxysilane, ethyltriisopropoxysilane, vinyltrimethoxysilane, vinyltriethoxysilane, vinyltri-n-propoxysilane, vinyltriisopropoxysilane, n-propyltrimethoxysilane, n-propyltriethoxysilane, n-propyltri-n-propoxysilane, n-propyltriisopropoxysilane, i-propyltrimethoxysilane, propyltriethoxysilane, i-propyltri-n-propoxysilane, propyltriisopropoxysilane, n-butyltrimethoxysilane, n-butyltriethoxysilane, n-butyltri-n-propoxysilane, n-butyltriisopropoxysilane, sec-butyltrimethoxysilane, sec-butyltriethoxysilane, sec-butyltri-n-propoxysilane, sec-butyltriisopropoxysilane, t-butyltrimethoxysilane, t-butyltriethoxysilane, t-butyltri-n-propoxysilane, t-butyltriisopropoxysilane, cyclopropyltrimethoxysilane, cyclopropyltriethoxysilane, cyclopropyltri-n-propoxysilane, cyclopropyltriisopropoxysilane, cyclobutyltrimethoxysilane, cyclobutyltriethoxysilane, cyclobutyltri-n-propoxysilane, cyclobutyltriisopropoxysilane, cyclopentyltrimethoxysilane, cyclopentyltriethoxysilane, cyclopentyltri-n-propoxysilane, cyclopentyltriisopropoxysilane, cyclohexyltrimethoxysilane, cyclohexyltriethoxysilane, cyclohexyltri-n-propoxysilane, cyclohexyltriisopropoxysilane, cyclohexenyltrimethoxysilane, cyclohexenyltriethoxysilane, cyclohexenyltri-n-propoxysilane, cyclohexenyltriisopropoxysilane, cyclohexenylethyltrimethoxysilane, cyclohexenylethyltriethoxysilane, cyclohexenylethyltri-n-propoxysilane, cyclohexenylethyltriisopropoxysilane, cyclooctanyltrimethoxysilane, cyclooctanyltriethoxysilane, cyclooctanyltri-n-propoxysilane, cyclooctanyltriisopropoxysilane, cyclopentadienylpropyltrimethoxysilane, cyclopentadienylpropyltriethoxysilane, cyclopentadienylpropyltri-n-propoxysilane, cyclopentadienylpropyltriisopropoxysilane, bicycloheptenyltrimethoxysilane, bicycloheptenyltriethoxysilane, bicycloheptenyltri-n-propoxysilane, bicycloheptenyltriisopropoxysilane, bicycloheptyltrimethoxysilane, bicycloheptyltriethoxysilane, bicycloheptyltri-n-propoxysilane, bicycloheptyltriisopropoxysilane, adamantyltrimethoxysilane, adamantyltriethoxysilane, adamantyltri-n-propoxysilane and adamantyltriisopropoxysilane can be exemplified. As the light absorbable monomers, phenyltrimethoxysilane, phenyltriethoxysilane, phenyltri-n-propoxysilane, phenyltriisopropoxysilane, benzyltrimethoxysilane, benzyltriethoxysilane, benzyltri-n-propoxysilane, benzyltriisopropoxysilane, tolyltrimethoxysilane, tolyltriethoxysilane, tolyltri-n-propoxysilane, tolyltriisopropoxysilane, phenethyltrimethoxysilane, phenethyltriethoxysilane, phenethyltri-n-propoxysilane, phenethyltriisopropoxysilane, naphthyltrimethoxysilane, naphthyltriethoxysilane, naphthyltri-n-propoxysilane and naphthyltriisopropoxysilane can be exemplified.

Preferable are methyltrimethoxysilane, methyltriethoxysilane, ethyltrimethoxysilane, ethyltriethoxysilane, vinyltrimethoxysilane, vinyltriethoxysilane, n-propyltrimethoxysilane, n-propyltriethoxysilane, isopropyltrimethoxysilane, isopropyltriethoxysilane, n-butyltrimethoxysilane, n-butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane and phenethyltriethoxysilane.

For example, as dialkoxysilane where m1=1, m2=1 and m3=0, dimethyldimethoxysilane, dimethyldiethoxysilane, methylethyldimethoxysilane, methylethyldiethoxysilane, dimethyldi-n-propoxysilane, dimethyldiisopropoxysilane, diethyldimethoxysilane, diethyldiethoxysilane, diethyldi-n-propoxysilane, diethyldiisopropoxysilane, di-n-propyldimethoxysilane, di-n-propyldiethoxysilane, di-n-propyldi-n-propoxysilane, di-n-propyldiisopropoxysilane, diisopropyldimethoxysilane, diisopropyldiethoxysilane, diisopropyldi-n-propoxysilane, diisopropyldiisopropoxysilane, di-n-butyldimethoxysilane, di-n-butyldiethoxysilane, di-n-butyldi-n-propoxysilane, di-n-butyldiisopropoxysilane, di-sec-butyldimethoxysilane, di-sec-butyldiethoxysilane, di-sec-butyldi-n-propoxysilane, di-sec-butyldiisopropoxysilane, di-t-butyldimethoxysilane, di-t-butyldiethoxysilane, di-t-butyldi-n-propoxysilane, di-t-butyldiisopropoxysilane, dicyclopropyldimethoxysilane, dicyclopropyldiethoxysilane, dicyclopropyldi-n-propoxysilane, dicyclopropyldiisopropoxysilane, dicyclobutyldimethoxysilane, dicyclobutyldiethoxysilane, dicyclobutyldi-n-propoxysilane, dicyclobutyldiisopropoxysilane, dicyclopentyldimethoxysilane, dicyclopentyldiethoxysilane, dicyclopentyldi-n-propoxysilane, dicyclopentyldiisopropoxysilane, dicyclohexyldimethoxysilane, dicyclohexyldiethoxysilane, dicyclohexyldi-n-propoxysilane, dicyclohexyldiisopropoxysilane, dicyclohexenyldimethoxysilane, dicyclohexenyldiethoxysilane, dicyclohexenyldi-n-propoxysilane, dicyclohexenyldiisopropoxysilane, dicyclohexenylethyldimethoxysilane, dicyclohexenylethyldiethoxysilane, dicyclohexenylethyldi-n-propoxysilane, dicyclohexenylethyldiisopropoxysilane, dicyclooctanyldimethoxysilane, dicyclooctanyldiethoxysilane, dicyclooctanyldi-n-propoxysilane, dicyclooctanyldiisopropoxysilane, dicyclopentadienylpropyldimethoxysilane, dicyclopentadienylpropyldiethoxysilane, dicyclopentadienylpropyldi-n-propoxysilane, dicyclopentadienylpropyldiisopropoxysilane, bisbicycloheptenyldimethoxysilane, bisbicycloheptenyldiethoxysilane, bisbicycloheptenyldi-n-propoxysilane, bisbicycloheptenyldiisopropoxysilane, bisbicycloheptyldimethoxysilane, bisbicycloheptyldiethoxysilane, bisbicycloheptyldi-n-propoxysilane, bisbicycloheptyldiisopropoxysilane, bisadamantyldimethoxysilane, bisadamantyldiethoxysilane, bisadamantyldi-n-propoxysilane and bisadamantyldiisopropoxysilane etc. can be exemplified. As the light absorbable monomers, diphenyldimethoxysilane, diphenyldiethoxysilane, methylphenyldimethoxysilane, methylphenyldiethoxysilane, diphenyldi-n-propoxysilane and diphenyldiisopropoxysilane etc. can be exemplified.

Preferably dimethyldimethoxysilane, dimethyldiethoxysilane, diethyldimethoxysilane, diethyldiethoxysilane, methylethyldimethoxysilane, methylethyldiethoxysilane, di-n-propyldimethoxysilane, di-n-butyldimethoxysilane, methylphenyldimethoxysilane and methylphenyldiethoxysilane etc. can be exemplified.

For example, as monoalkoxysilane where m1=1, m2=1 and m3=1, trimethylmethoxysilane, trimethylethoxysilane, dimethylethylmethoxysilane and dimethylethylethoxysilane etc. can be exemplified. As the light absorbable monomers, dimethylphenylmethoxysilane, dimethylphenylethoxysilane, dimethylbenzylmethoxysilane, dimethylbenzylethoxysilane, dimethylphenethylmethoxysilane and dimethylphenethylethoxysilane etc. can be exemplified.

Preferably trimethylmethoxysilane, dimethylethylmethoxysilane, dimethylphenylmethoxysilane, dimethylbenzylmethoxysilane and dimethylphenethylmethoxysilane etc. can be exemplified.

Other examples of the organic groups represented by the above $R^1$, $R^2$ and $R^3$ can include organic groups having one or more carbon-oxygen single bonds or carbon-oxygen double bonds. Specifically, they are the organic groups having one or more groups selected from the group consisting of epoxy, ester, alkoxy and hydroxy groups. The organic groups having one or more carbon-oxygen single bonds or carbon-oxygen double bonds in the general formula (1) can include those represented by the following general formula (2) as examples.

$$(P-Q_1-(S_1)_{v1}-Q_2-)_u-(T)_{v2}-Q_3-(S_2)_{v3}-Q_4-) \quad (2)$$

(wherein P represents a hydrogen atom, a hydroxyl group, a group having an epoxy ring represented by the following formula,

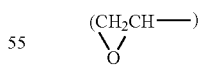

an alkoxy group having 1 to 4 carbon atoms, an alkylcarbonyloxy group having 1 to 6 carbon atoms or an alkylcarbonyl group having 1 to 6 carbon atoms, $Q_1$, $Q_2$, $Q_3$ and $Q_4$ each independently represents $-C_qH_{(2q-p)}P_p-$ (wherein P is the same as before, p is an integer of 0 to 3, q is an integer of 1 to 10), u is an integer of 0 to 3, $S_1$ and $S_2$ each independently represents —O—, —CO—, —OCO—, —COO— or —COO—, and v1, v2 and v3 each independently represents 0 or 1. Together with them, T represents a divalent group composed of an alicyclic ring or an aromatic ring. Examples of T are shown below. A position bound to $Q_2$ and $Q_3$ in T is not particularly restricted, and can be appropriately selected in consideration of reactivity due to a steric factor and availability of commercially available reagents used for the reaction.

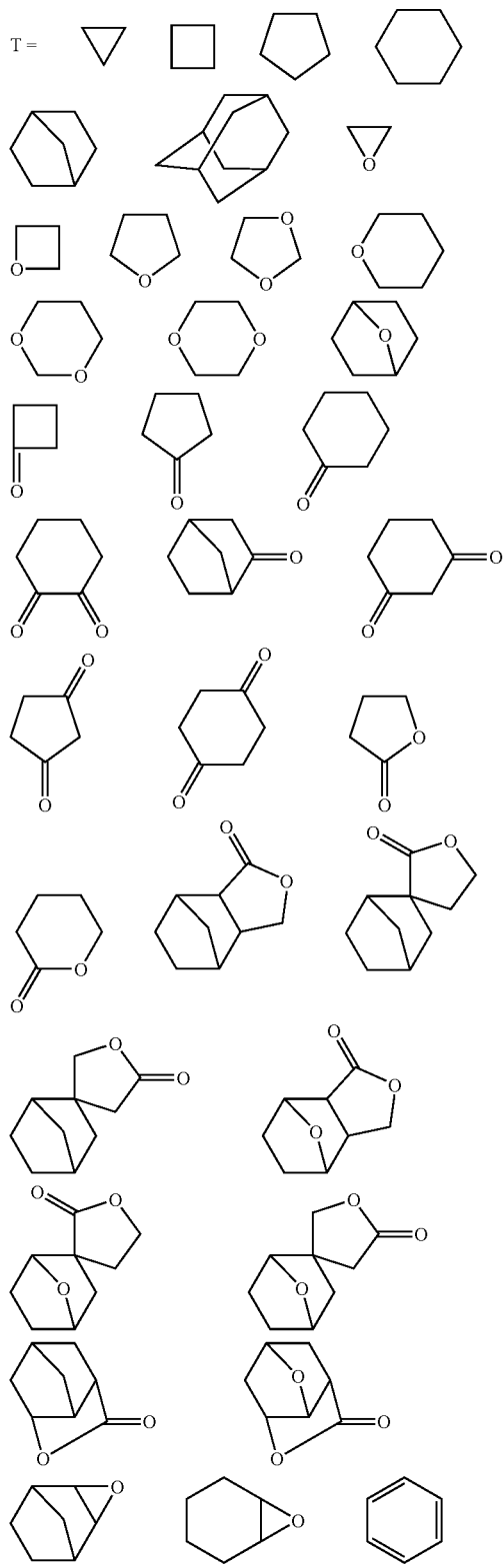

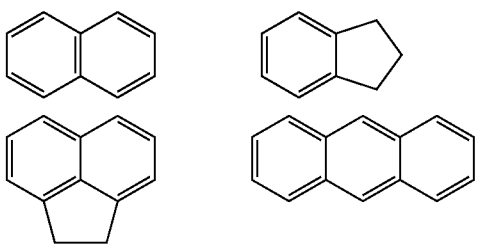

Preferable examples of the organic group having one or more carbon-oxygen single bonds or carbon-oxygen double bonds in the general formula (1) can include the followings. In the following formulae, (Si) was described in order to indicate a binding site of Si.

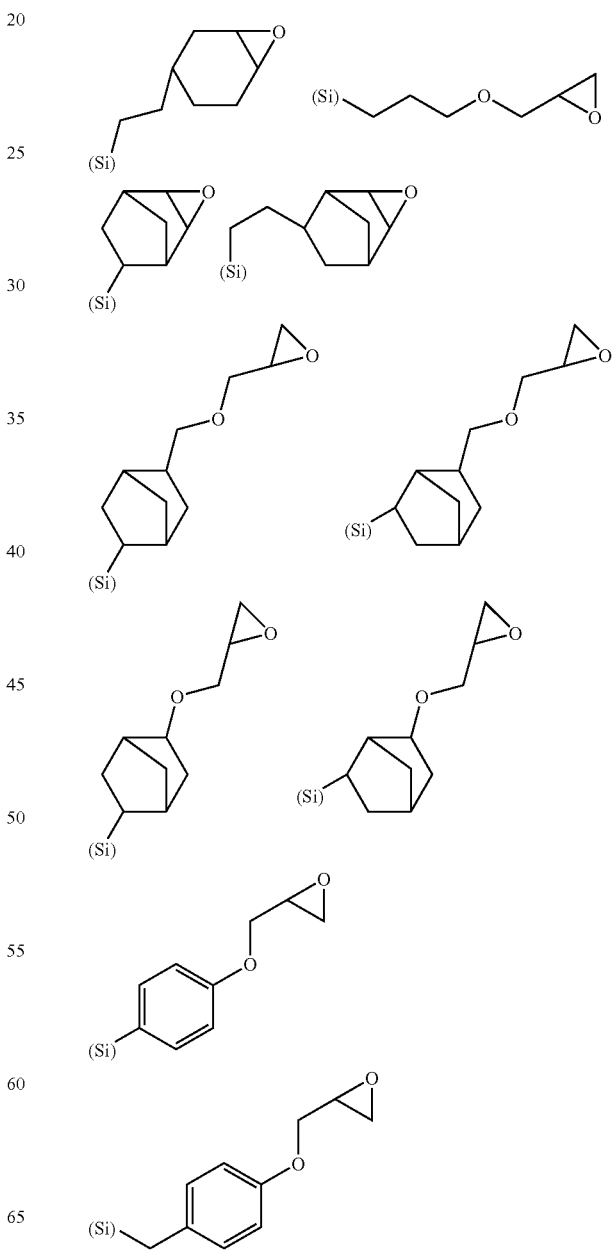

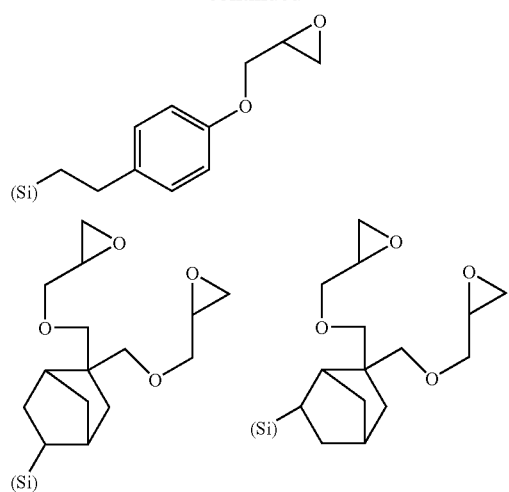
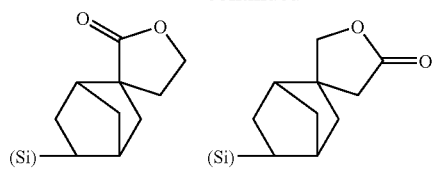
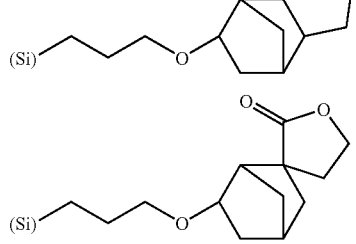
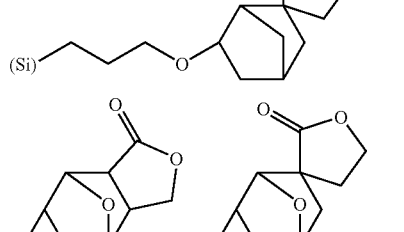
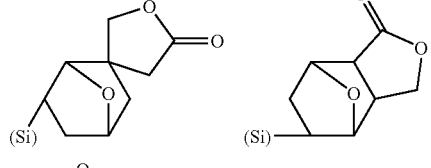
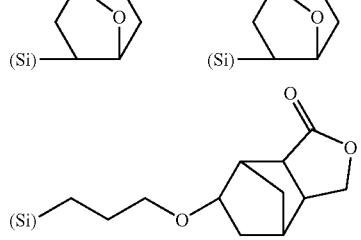
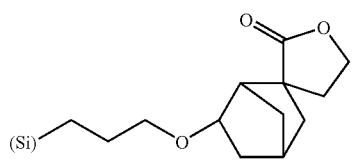
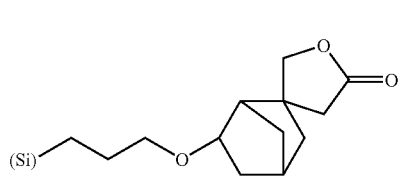

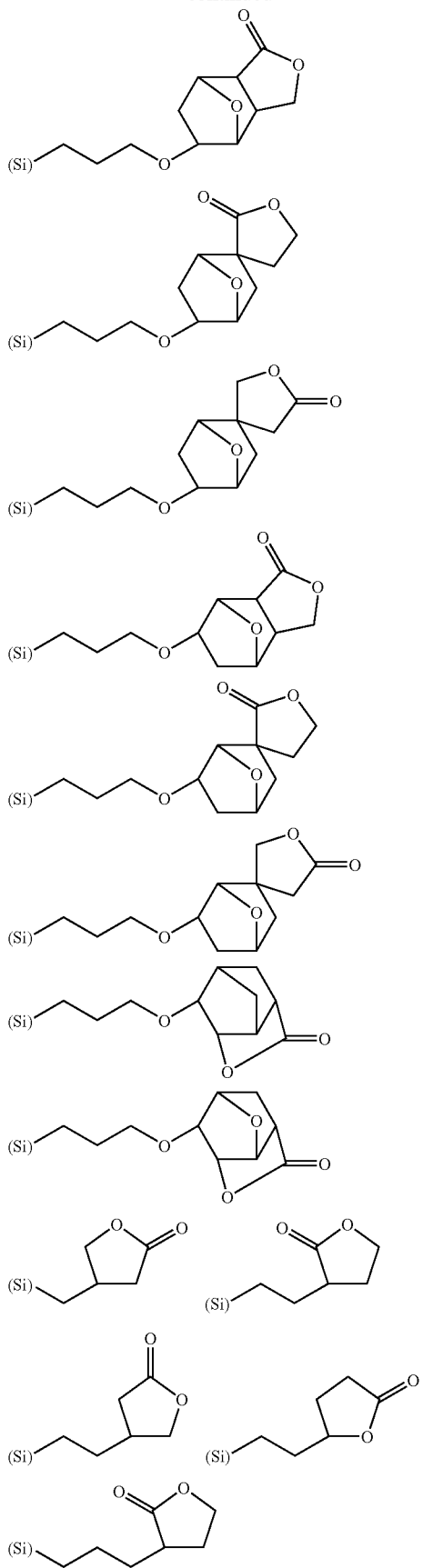
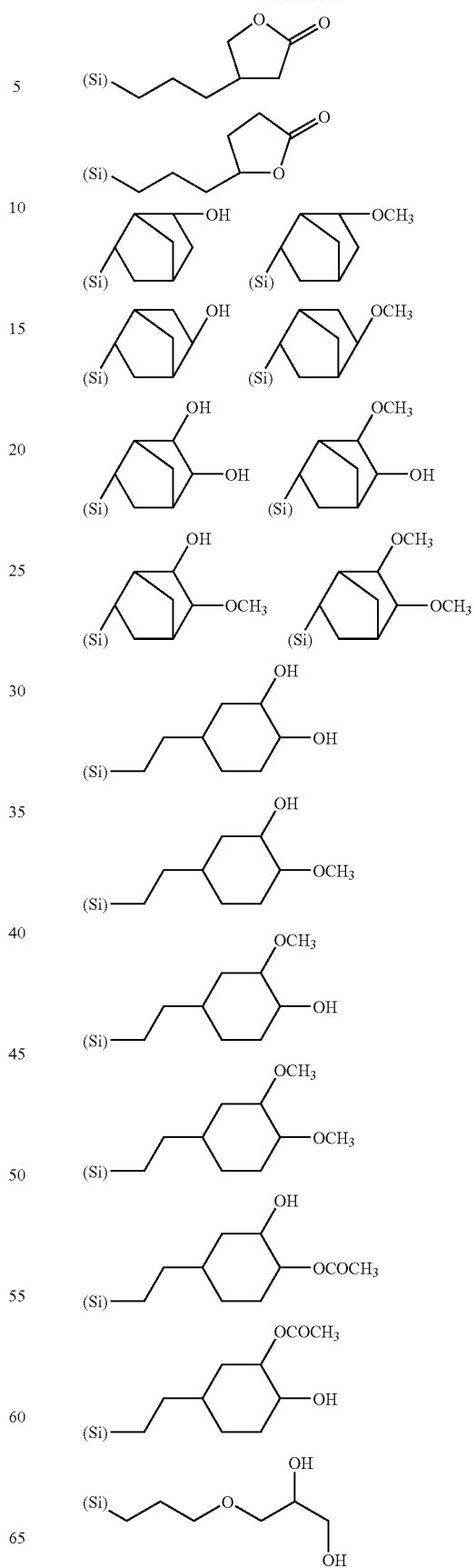

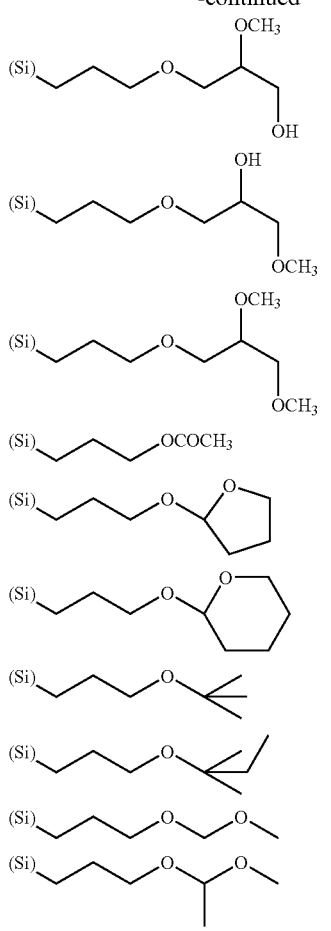

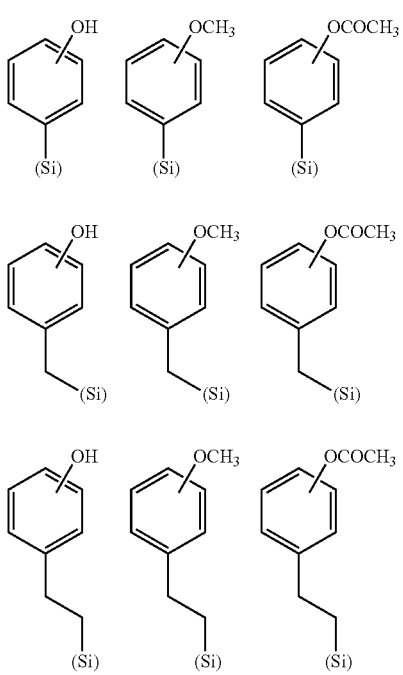

As examples of the organic groups of $R^1$, $R^2$ and $R^3$, the organic group containing the silicon-silicon bond can also be used. Specifically the followings can be included.

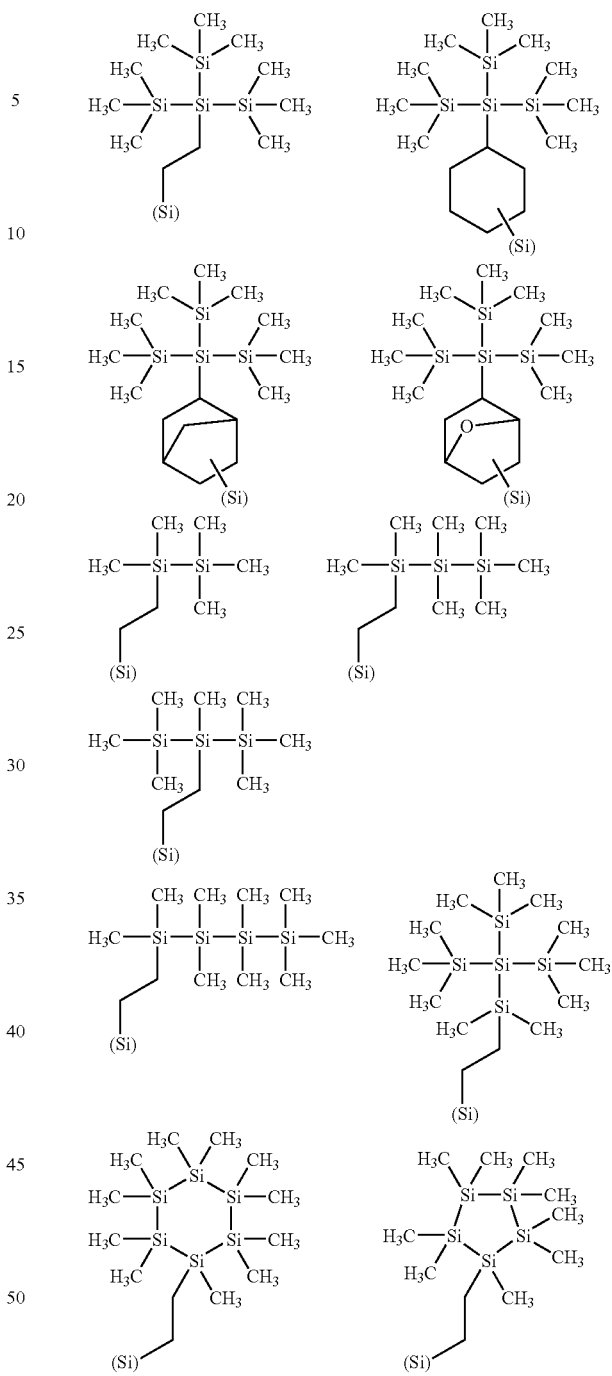

One or two or more can be selected from these monomers, and mixed before the reaction or during the reaction to make a reaction raw material for forming the siloxane polymer.

The solvent contained in the siloxane polymer solution is preferably the one not dissolving the photoresist pattern 3' and the crosslinked part 6.

Finally, the step (4) will be explained.

In the step (4), the uncrosslinked silloxane polymer 5' and the photoresist pattern 3' are removed (FIG. 1(j)). In the case in which the upper part 7 of the photoresist pattern is exposed at the time of applying the siloxane polymer solution in the step (3) such as in the case of FIG. 1(h), for example, the uncrosslinked siloxane polymer 5' and the photoresist pattern 3' can be removed simultaneously by a solvent.

The solvent to remove the uncrosslinked siloxane polymer 5' and the photoresist pattern 3' is not particularly restricted as far as it can dissolve them. For example, a solution of propylene glycol methyl ether/propylene glycol methyl ether acetate and the like may be used.

Figure 3:
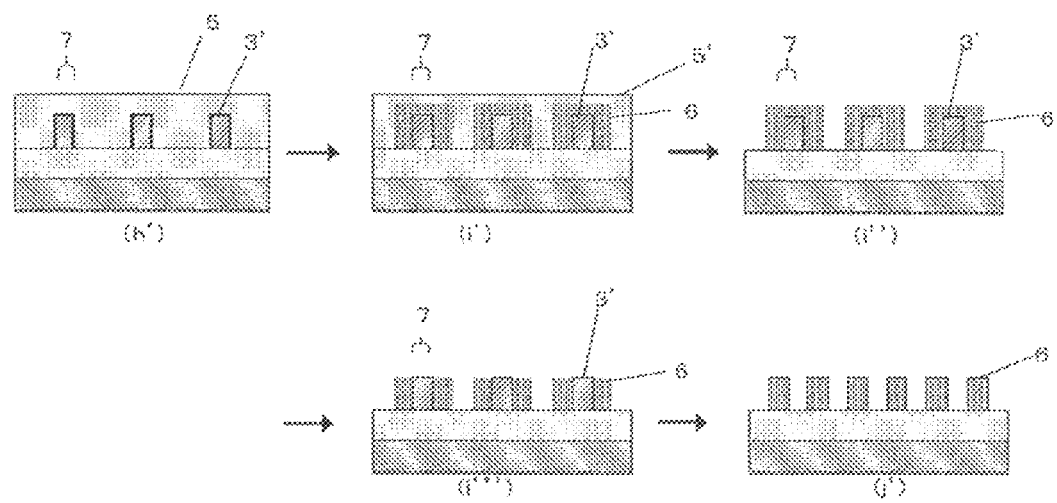
FIG. 3 is an explanatory drawing of further another embodiment of the patterning process of the present invention.

On the other hand, in the case in which the siloxane polymer solution is applied rather thick in the step (3) such as in the case of FIG. 3(h'), the upper part 7 of the photoresist pattern is not exposed because the upper part 7 of the photoresist pattern is covered with the crosslinked part 6 (FIG. 3(i')).

In such a case, for example, firstly the uncrosslinked siloxane polymer 5' is removed by using the solvent like the one as mentioned above (FIG. 3(i'')), then the crosslinked part 6 is dry etched until the upper part 7 of the photoresist pattern 3' is exposed (FIG. 3(i''')), and finally the photoresist pattern 3' can be removed by using the solvent like the one as mentioned above (FIG. 3(j')).

EXAMPLES

Hereinbelow, the present invention will be explained specifically by Examples, but the present invention is not limited by these descriptions.

Example 1

Step (1): Formation of the Organic Underlayer Film

Firstly, a composition containing 28 parts by mass of 4,4'-(9H-fluorene-9-ylidene)bisphenol novolak resin (molecular weight of 11,000) and 100 parts by mass of a PGMEA solution (propylene glycol monomethyl ether acetate) was applied as the organic underlayer composition on a Si wafer by a spin coating method, and then heated at 200° C. for one minute to form an organic film as an underlayer film with the film thickness of 300 nm. Many resins including a novolak resin other than the foregoing resin are known as the resist underlayer composition of the multilayer resist methods, and any of them may be used.

Step (1): Formation of the Photoresist Pattern

Further, in order to form the resist film on the organic underlayer film, the chemically amplified positive photoresist composition was prepared by dissolving a composition comprising, in accordance with Table 1, a resin, an acid generator, and a basic compound into a solvent containing 0.1% by mass of FC-4430 (manufactured by Sumitomo 3M Limited) and then by filtering thorough a 0.1 μm filter made of a fluorinated resin.

TABLE 1

| No. | resin (parts by mass) | acid generator (parts by mass) | basic compound (parts by mass) | solvent (parts by mass) |
|---|---|---|---|---|
| SL resist for ArF | ArF monolayer resist polymer (100) | PAG1 (6.6) | TMMEA (0.8) | PGMEA (2,500) |

In Table 1, the following substances were used as the ArF monolayer resist polymer, PAG 1, and TMMEA.

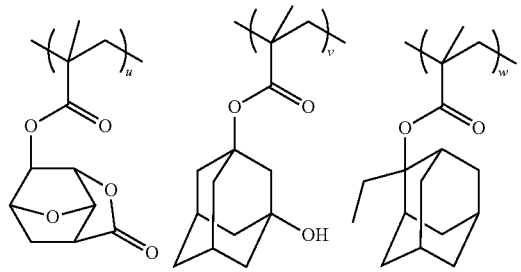

(ArF monolayer resist polymer)
(u = 0.40, v = 0.30, w = 0.30, Mw 7,800)

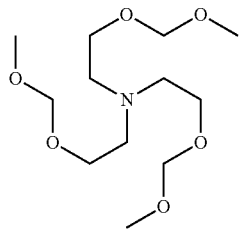

TMMEA

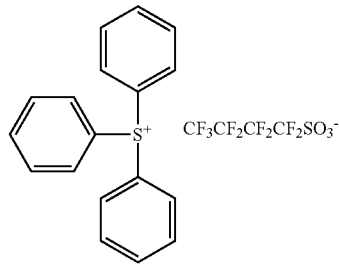

PAG1

The liquid-immersion top coat (TC-1) was prepared by dissolving the resin composed as shown by Table 2 in the solvent and then filtering the resulting solution through a 0.1 μm filter made of a fluorinated resin.

TABLE 2

| | resin (parts by mass) | organic solvent (parts by mass) |
|---|---|---|
| TC-1 | top coat polymer (100) | diisoamyl ether (2700) 2-methyl-1-butanol (270) |

Polymer for the Top Coat:
  Molecular weight (Mw): 8,800
  Dispersivity (Mw/Mn): 1.69

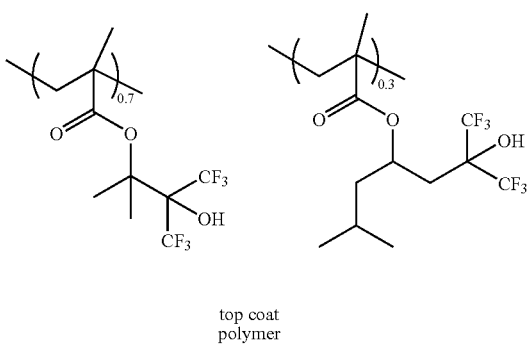

top coat polymer

Then, the resist film thus obtained was exposed by using an ArF liquid immersion exposure instrument (NSR-S610C, NA=1.30, σ 0.98/0.65, 35 degree dipole polarized illumination, and 6% half tone phase shift mask, manufactured by Nikon, Corp.), baked at 100° C. for 60 seconds (PEB: post exposure bake), and then developed for 30 seconds by using an aqueous tetramethyl ammonium hydroxide solution (TMAH) having the concentration of 2.38% by mass to obtain the positive type line-and-space pattern with the size of 40 nm and the pitch of 160 nm.

Step (2): Treatment by the Alkaline Solution

Onto the photoresist pattern obtained as mentioned above was applied a 4-methyl-2-pentanol solution containing 1% tetramethyl ammonium hydroxide as the alkaline solution containing an alkaline substance. After it was allowed to stand for 30 seconds at room temperature, the substrate was rotated to drain off the excess 4-methyl-2-pentanol solution containing 1% tetramethyl ammonium hydroxide.

Then, the photoresist pattern attached with the alkaline solution on its surface was formed by rinsing with 4-methyl-2-pentanol.

Step (3): Formation of the Crosslinked Part

The siloxane polymer solution to be applied onto the photoresist pattern attached with the alkaline solution was prepared as following.

Preparation of the Siloxane Polymer Solution

Into a 1000 mL glass flask containing 60 g of methanol, 200 g of ion-exchanged water, and 1 g of 35% hydrochloric acid was added a mixture of 50 g of tetraethoxysilane and 100 g of methyltrimethoxysilane and 10 g of phenyltrimethoxysilane at room temperature. Subsequently, the resulting mixture was subjected to the hydrolysis-condensation reaction as it was at room temperature for 8 hours, and then methanol and by-produced ethanol were distilled out under reduced pressure. Then, 800 mL of ethyl acetate and 300 mL of 4-methyl-2-pentanol were added into it, and then the aqueous layer was separated to remove hydrochloric acid used in the reaction. Into the remained organic layer was added 100 mL of 1% maleic acid aqueous solution, and then they were stirred, settled, and separated into the layers. A series of these procedures was repeated twice. Then, 100 mL of ion-exchanged water was added, and the resulting mixture was stirred, settled, and separated into the layers. A series of these procedures was repeated three times. Into the remained organic layer was added 200 mL of 4-methyl-2-pentanol, and then the resulting mixture was concentrated under reduced pressure to obtain 300 g of the 4-methyl-2-pentanol solution containing the siloxane polymer (polymer concentration of 21%). The chlorine ion was not detected in the obtained solution by an ion chromatography analysis. The polystyrene-equivalent molecular weight (Mw) of this polymer was 2,000.

In order to form the siloxane polymer sidewall (crosslinked part) onto the photoresist pattern that was attached with the alkaline solution as mentioned above, the following materials were mixed, homogenized, and then filtered through a 0.1 μm filter made of a fluorinated resin to prepare the siloxane polymer solution.

The foregoing polymer solution with 21% concentration: 10 parts by mass
4-Methyl-2-pentanol: 90 parts by mass This siloxane polymer solution was applied by a spin coating method, and then heated on a hot plate at 80° C. for 60 seconds to form the crosslinked part by crosslinking the siloxane polymer near the photoresist patterns.

Step (4): Removal of the Uncrosslinked Siloxane Polymer and the Photoresist Pattern Then, the uncrosslinked siloxane polymer and the photoresist pattern were removed by rinsing with a 7/3 mixture solution of propylene glycol methyl ether/propylene glycol methyl ether acetate. After the rinsing, the remained siloxane pattern (crosslinked part) was heat-treated at 150° C. for 60 seconds to facilitate the crosslinking. With this, the pattern of the crosslinked part (siloxane pattern) with the pattern size of 40 nm and the pattern pitch of 80 nm could be obtained.

Example 2

In the step (1) of Example 1, after the organic underlayer film was formed, ARC-29A (manufactured by Nissan Chemical Industries, Ltd.) was applied by a spin coating method and then heated at 180° C. for one minute to form the organic anti-reflection film with the film thickness of 80 nm. Subsequently, procedures from the step (1) (formation of the photoresist pattern) to the step (4) (removal of the uncrosslinked siloxane polymer and the photoresist pattern) of Example 1 were followed in a similar manner to that of Example 1 to obtain the crosslinked part (siloxane pattern) with the pattern size of 40 nm and the pattern pitch of 80 nm.

As mentioned above, according to the patterning process of the present invention, the siloxane pattern (crosslinked part) having the one-half pitch relative to the original pattern (photoresist pattern) could be formed.

Further, by using a usual method, the organic underlayer film could be dry etched by using the mask of the formed siloxane pattern (crosslinked part), and then the substrate could be dry etched by using the mask of the organic underlayer film having the formed pattern.

It must be stated here that the present invention is not limited to the embodiments as mentioned above. The embodiments as mentioned above are merely examples so that any embodiments composed of substantially the same technical concept as those disclosed in the claims of the present invention and expressing a similar effect are included in the technical scope of the present invention.

What is claimed is:

1. A patterning process to form a pattern on a substrate by a lithography, wherein the patterning process comprises:
   (1) a step of forming a photoresist pattern, involving forming an organic underlayer film on a substrate, forming a resist film on the organic underlayer film by using a chemically amplified positive photoresist composition, exposing the resist film to a high energy beam, and then developing the resist film by a developer,
   (2) a step of attaching an alkaline solution containing an alkaline substance onto the photoresist pattern, and then removing the excess alkaline solution,
   (3) a step of applying a solution of a siloxane polymer crosslinkable by action of the alkaline substance onto the photoresist pattern attached with the alkaline solution to fill a space between neighboring photoresist patterns with the siloxane polymer thereby forming a crosslinked part by crosslinking the siloxane polymer near the photoresist patterns to form a repeating structure arranged sequentially in the order of the photoresist pattern, the crosslinked part, the uncrosslinked siloxane polymer, and the crosslinked part, and (4) a step of removing the uncrosslinked siloxane polymer and the photoresist pattern.

2. The patterning process according to claim 1, wherein an anti-reflection film is formed between the organic underlayer film and the resist film in the step (1).

3. The patterning process according to claim 2, wherein an organic anti-reflection film not containing a silicon atom is formed as the anti-reflection film.

4. The patterning process according to claim 3, wherein the alkaline solution to be attached onto the photoresist pattern is an organic solvent solution or an aqueous solution containing an organic amine or an organic ammonium hydroxide.

5. The patterning process according to claim 4, wherein as the alkaline solution to be attached onto the photoresist pattern, an alkaline solution not dissolving the photoresist pattern is used.

6. The patterning process according to claim 5, wherein, in the step (3), the crosslinked part is formed by a heat-treatment at the temperature of 30 to 200° C. and the time of 1 to 500 seconds after filling the space between the neighboring photoresist patterns with the siloxane polymer.

7. The patterning process according to claim 6, wherein, in the step (4), the uncrosslinked siloxane polymer is removed, and thereafter the photoresist pattern is removed.

8. The patterning process according to claim 6, wherein, in the step (4), the uncrosslinked siloxane polymer and the photoresist pattern are removed simultaneously.

9. The patterning process according to claim 8, wherein a product obtained from the hydrolysis-condensation of a monomer represented by the following general formula (I) is used as the siloxane polymer crosslinkable by action of the alkaline substance,

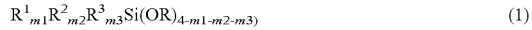

wherein, R represents an alkyl group having 1 to 3 carbon atoms; each $R^1$, $R^2$, and $R^3$ independently represents a hydrogen atom or a monovalent organic group having 1 to 30 carbon atoms; and m1, m2, and m3 independently represents 0 or 1.

10. The patterning process according to claim 2, wherein the alkaline solution to be attached onto the photoresist pattern is an organic solvent solution or an aqueous solution containing an organic amine or an organic ammonium hydroxide.

11. The patterning process according to claim 1, wherein the alkaline solution to be attached onto the photoresist pattern is an organic solvent solution or an aqueous solution containing an organic amine or an organic ammonium hydroxide.

12. The patterning process according to claim 1, wherein as the alkaline solution to be attached onto the photoresist pattern, an alkaline solution not dissolving the photoresist pattern is used.

13. The patterning process according to claim 1, wherein, in the step (3), the crosslinked part is formed by a heat-treatment at the temperature of 30 to 200° C. and the time of 1 to 500 seconds after filling the space between the neighboring photoresist patterns with the siloxane polymer.

14. The patterning process according to claim 1, wherein, in the step (4), the uncrosslinked siloxane polymer is removed, and thereafter the photoresist pattern is removed.

15. The patterning process according to claim 1, wherein, in the step (4), the uncrosslinked siloxane polymer and the photoresist pattern are removed simultaneously.

16. The patterning process according to claim 1, wherein a product obtained from the hydrolysis-condensation of a monomer represented by the following general formula (I) is used as the siloxane polymer crosslinkable by action of the alkaline substance,

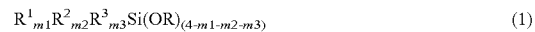

wherein, R represents an alkyl group having 1 to 3 carbon atoms; each $R^1$, $R^2$, and $R^3$ independently represents a hydrogen atom or a monovalent organic group having 1 to 30 carbon atoms; and m1, m2, and m3 independently represents 0 or 1.

17. The patterning process according to claim 1, wherein in the step (1), the chemically amplified positive resist composition contains a resin having a repeating unit represented by a following general formula (a1)

wherein, $R^{101}$ represent a hydrogen atom or a methyl group, and $R^{102}$ represents an acid-labile group, and a carboxylic acid residue after the acid-labile group $R^{102}$ is eliminated is distributed on a surface of the photoresist pattern, and in the step (2), the attaching is conducted by a neutralization reaction between the carboxylic acid residue on the surface of the photoresist pattern and the alkaline substance in the alkaline solution.

* * * * *